(12) United States Patent
Jiang et al.

(10) Patent No.: US 10,834,693 B2
(45) Date of Patent: Nov. 10, 2020

(54) SYNCHRONIZATION SYSTEM AND METHOD BASED ON WIRELESS OR LIMITED CABLE INTERCONNECTION AND MR SYSTEM

(71) Applicant: GE Precision Healthcare LLC, Wauwatosa, WI (US)

(72) Inventors: Xin Jiang, ShangHai (CN); Tingting Song, ShangHai (CN); Desmond Teck Beng Yeo, Niskayuna, NY (US); Thomas Kwok-Fah Foo, Niskayuna, NY (US); Jing Li, ShangHai (CN)

(73) Assignee: GE PRECISION HEALTHCARE LLC, Wauwatosa, WI (US)

( * ) Notice: Subject to any disclaimer, the term of this patent is extended or adjusted under 35 U.S.C. 154(b) by 0 days.

(21) Appl. No.: 16/172,394

(22) Filed: Oct. 26, 2018

(65) Prior Publication Data
US 2019/0132813 A1 May 2, 2019

(30) Foreign Application Priority Data
Oct. 26, 2017 (CN) .......................... 2017 1 1017663

(51) Int. Cl.
*G01R 33/32* (2006.01)
*G01R 33/422* (2006.01)
(Continued)

(52) U.S. Cl.
CPC ........ *H04W 56/0045* (2013.01); *G01R 33/32* (2013.01); *G01R 33/3692* (2013.01);
(Continued)

(58) Field of Classification Search
None
See application file for complete search history.

(56) References Cited

U.S. PATENT DOCUMENTS 7,750,635 B2  7/2010  Van et al.
8,502,540 B2  8/2013  Nakanishi et al.
(Continued)

FOREIGN PATENT DOCUMENTS

CN  103123386 B  4/2016

OTHER PUBLICATIONS

Sohn et al., "RF Multi-Channel Head Coil Design with Improved B1+ Fields Uniformity for High Field MRI Systems", IEEE MTT-S International Microwave Symposium Digest, Jun. 17-22, 2012.
(Continued)

*Primary Examiner* — Jermele M Hollington
(74) *Attorney, Agent, or Firm* — Armstrong Teasdale LLP

(57) ABSTRACT

A synchronization system based on wireless or limited cable interconnection is disclosed, which includes a central unit comprising a delay compensation module, and RF transmission channels. At least one channel comprises a clock controller and a synchronization controller. The central unit transmits a controlled clock signal and a controlled synchronization signal to the at least one channel, and receives a clock echo signal and a synchronization echo signal. The delay compensation module estimates a clock phase compensation based on the controlled clock signal transmitted and the clock echo signal received, and a synchronization delay compensation based on the controlled synchronization signal transmitted and the synchronization echo signal received. The clock controller and the synchronization controller adjusts respectively a clock signal and a synchronization signal received from the at least one channel based on the clock phase compensation and the synchronization delay compensation. MR systems and a synchronization method are also disclosed.

21 Claims, 6 Drawing Sheets

(51) Int. Cl.
  *H04W 56/00*   (2009.01)
  *H04B 17/364*  (2015.01)
  *H04B 17/391*  (2015.01)
  *G01R 33/36*   (2006.01)

(52) U.S. Cl.
  CPC ......... *G01R 33/422* (2013.01); *H04B 17/364* (2015.01); *H04B 17/391* (2015.01); *H04W 56/009* (2013.01)

(56) References Cited

U.S. PATENT DOCUMENTS

| | | | |
|---|---|---|---|
| 8,878,536 | B2 | 11/2014 | Evers et al. |
| 8,971,427 | B2 | 3/2015 | Akita et al. |
| 9,229,075 | B2 | 1/2016 | Cho et al. |
| 2008/0231274 | A1 | 9/2008 | Fontius et al. |
| 2009/0311970 | A1 | 12/2009 | Tuccillo |
| 2012/0161765 | A1* | 6/2012 | Takei ............... A61B 5/055 324/309 |
| 2013/0271126 | A1 | 10/2013 | Griswold et al. |
| 2015/0066413 | A1 | 3/2015 | Bhagat et al. |
| 2015/0362574 | A1 | 12/2015 | Wu et al. |
| 2016/0033591 | A1 | 2/2016 | Leussler et al. |
| 2016/0154074 | A1* | 6/2016 | Okamoto ........... G01R 33/5659 324/322 |
| 2016/0231407 | A1* | 8/2016 | Biber ..................... G01R 33/28 |
| 2017/0097401 | A1* | 4/2017 | Bannae ................ G01R 33/543 |
| 2018/0376441 | A1* | 12/2018 | Reykowski ............... H04B 1/26 |
| 2020/0057129 | A1* | 2/2020 | Ji .......................... G01R 33/567 |

OTHER PUBLICATIONS

Connell et al., "General Coupling Matrix Synthesis for Decoupling MRI RF Arrays", IEEE Transactions on Medical Imaging, vol. 35, Issue 10, pp. 2229-2242, Oct. 2016.

Sohn et al., "A Compact, High Power Capable, and Tunable High Directivity Micro strip Coupler", IEEE Transactions on Microwave Theory and Techniques, vol. 64, Issue 10, pp. 3217-3223, Oct. 2016.

* cited by examiner

SYNCHRONIZATION SYSTEM AND METHOD BASED ON WIRELESS OR LIMITED CABLE INTERCONNECTION AND MR SYSTEM

TECHNICAL FIELD

This disclosure relates generally to the field of magnetic resonance (MR), and more particularly to a synchronization system and a synchronization method based on wireless or limited cable interconnection and a MR system.

BACKGROUND

MR methods which utilize the interaction between magnetic fields and nuclear spin to form two-dimensional (2D) or three-dimensional (3D) images are widely used, notably in the field of medical diagnostics, due to the superior soft tissue image contrast, and a wide range of ability to visualize different physiologic characteristics that are superior to other imaging methods in many respects, in addition to not requiring ionizing radiation and is primarily non-invasive.

Current MR systems generally use fiber optics or copper cables for digital data transferring during MR scanning or service. Continuous synchronized digital data is sent out to Radio Frequency (RF) sub-systems in the MR system through hard cables to create required RF waveforms, generate gradient fields, and receive imaging signals on time. When more and more channels are introduced or will be introduced into a RF transmitter (Tx) and receiver (Rx) subsystem in the MR system for better imaging quality, less SAR (Specific Absorption Rate), etc., the RF sub-system will become too complex and result in high cost for components and labors if multiple cables are used for interconnections. To simplify communication structure for the RF sub-system in the MR system, high bandwidth wireless solution can make multi-channel system simpler. However, regular wireless technology cannot be directly used to replace cable communication for the MR system for at least the following reasons:

The first is timing issue. Traditional wireless technology cannot guarantee accurate timing of data receiving, which means time cannot be used to directly control MR pulse sequence in real-time.

The second is synchronization issue. Without timing control by fixed clock/data distribution, synchronization failure will cause $B_1^+$ field (excitation field) failure between RF channels and will cause imaging failure between sub-systems.

Therefore, in the view of the foregoing, a need to solve MR image timing/synchronization issue is becoming increasingly urgent.

BRIEF DESCRIPTION

In one aspect of embodiments of the present disclosure, a synchronization system based on wireless or limited cable interconnection is provided. The synchronization system comprises a central unit comprising a delay compensation module, and a plurality of RF transmission channels each in communication with the central unit. At least one of the plurality of RF transmission channels comprises a clock controller and a synchronization controller. The central unit is configured to transmit a controlled clock signal and a controlled synchronization signal to the at least one RF transmission channel, and receive a clock echo signal and a synchronization echo signal from the at least one RF transmission channel. The delay compensation module of the central unit is configured to estimate a clock phase compensation of the at least one RF transmission channel based on the controlled clock signal transmitted and the clock echo signal received from the at least one RF transmission channel, and estimate a synchronization delay compensation of the at least one RF transmission channel based on the controlled synchronization signal transmitted and the synchronization echo signal received from the at least one RF transmission channel. The clock controller and the synchronization controller of the at least one RF transmission channel are respectively configured to adjust a clock signal received from the at least one RF transmission channel based on the clock phase compensation of the at least one RF transmission channel, and adjust a synchronization signal received from the at least one RF transmission channel based on the synchronization delay compensation of the at least one RF transmission channel.

In another aspect of embodiments of the present disclosure, a MR system is provided. The MR system comprises a RF transmission system, a RF receiving system, a gradient system, a sequencer and a clock source. The RF transmission system comprises the above-mentioned synchronization system. The sequencer is in communication with the RF transmission system, the RF receiving system and the gradient system, and is configured to generate a sequence to the RF transmission system, the RF receiving system and the gradient system. The clock source is configured to generate a clock signal and sending the clock signal to the sequencer, the RF transmission system, the RF receiving system and the gradient system. In response to an adjusted clock signal and an adjusted synchronization signal of the at least RF transmission channel in the RF transmission system, the at least one RF transmission channel starts to transmit a transmission data command in the sequence.

In still another aspect of embodiments of the present disclosure, a MR system is provided. The MR system comprises a RF transmission system, a RF receiving system, a gradient system, a sequencer, a clock source and a synchronization trigger for triggering an alignment signal. The sequencer is wirelessly communicated with the RF transmission system, the RF receiving system and the gradient system respectively, and is configured to generate a sequence to the RF transmission system, the RF receiving system and the gradient system. The clock source is wirelessly connected to the sequencer, the RF transmission system, the RF receiving system and the gradient system. In response to the alignment signal, the RF transmission system, the RF receiving system and the gradient system start to execute respective data commands in the sequence.

In yet another aspect of embodiments of the present disclosure, a synchronization method for RF transmission is provided. The synchronization method comprises transmitting a controlled clock signal and a controlled synchronization signal via at least one RF transmission channel; receiving a clock echo signal and a synchronization echo signal via the at least one RF transmission channel; estimating a clock phase compensation of the at least one RF transmission channel based on the controlled clock signal transmitted and the received clock echo signal of the at least one RF transmission channel, and a synchronization delay compensation of the at least one RF transmission channel based on the controlled synchronization signal transmitted and the received synchronization echo signal of the at least one RF transmission channel; and adjusting a clock signal received from the at least one RF transmission channel based on the clock phase compensation of the at least one RF transmission channel, and adjusting a synchronization signal received from the at least one RF transmission channel based on the synchronization delay compensation of the at least one RF transmission channel.

DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

Embodiments of the present disclosure will be described hereinbelow with reference to the accompanying drawings. In the following description, well-known functions or constructions are not described in detail to avoid obscuring the disclosure in unnecessary detail.

Unless defined otherwise, technical and scientific terms used herein have the same meaning as is commonly understood by one of ordinary skill in the art to which this disclosure belongs. The terms "first", "second", and the like, as used herein do not denote any order, quantity, or importance, but rather are used to distinguish one element from another. Also, the terms "a" and "an" do not denote a limitation of quantity, but rather denote the presence of at least one of the referenced items. The term "or" is meant to be inclusive and mean either or all of the listed items. The use of "including", "comprising" or "having" and variations thereof herein are meant to encompass the items listed thereafter and equivalents thereof as well as additional items. The terms "connected" and "coupled" are not restricted to physical or mechanical connections or couplings, and can include electrical connections or couplings, whether direct or indirect. In addition, terms indicating specific locations, such as "top", "bottom", "left", and "right", are descriptions with reference to specific accompanying drawings. Embodiments disclosed in the present disclosure may be placed in a manner different from that shown in the figures. Therefore, the location terms used herein should not be limited to locations described in specific embodiments.

Synchronization System Based on Wireless or Limited Cable Interconnection

Figure 1:
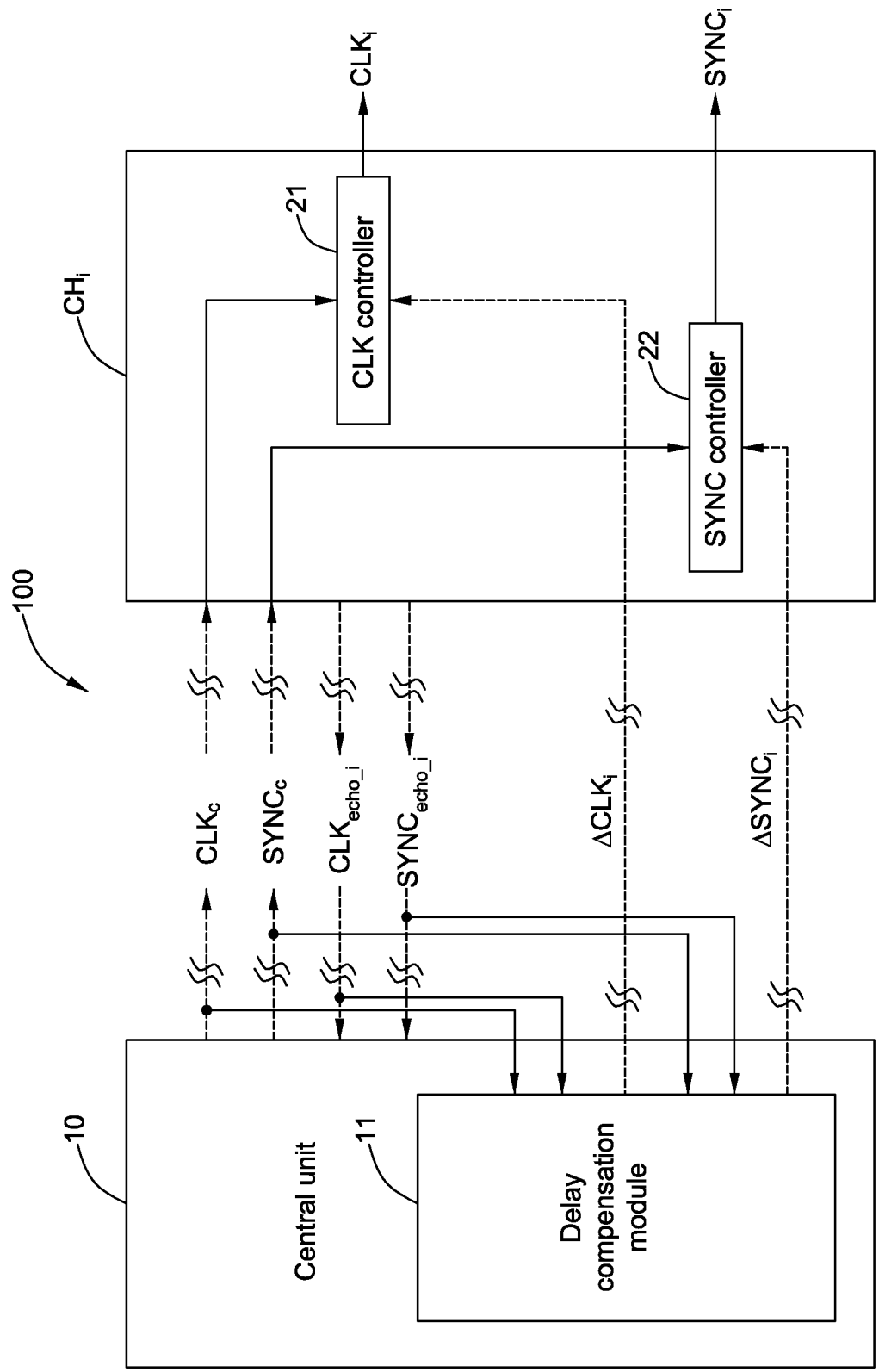
FIG. 1 is a schematic diagram of a synchronization system based on wireless or limited cable interconnection in accordance with an exemplary embodiment.
Figure 2:
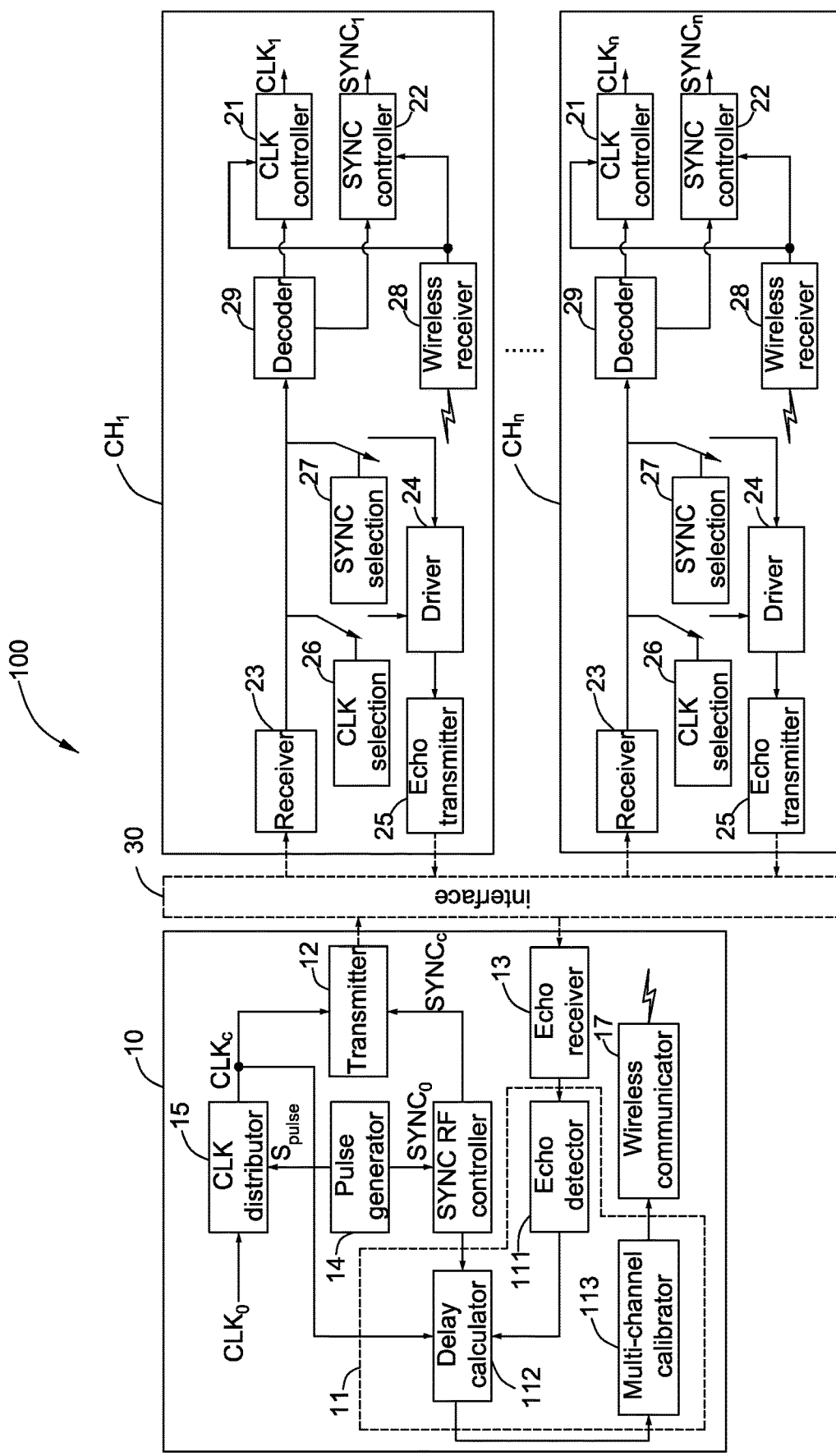
FIG. 2 is a detailed diagram of the synchronization system of FIG. 1.

FIG. 1 is a schematic diagram of an exemplary synchronization system 100 based on wireless or limited cable interconnection in accordance with an exemplary embodiment. As shown in FIG. 1, the synchronization system 100 for RF transmission includes a central unit 10 and a plurality of RF transmission channels $CH_1$-$CH_n$ (as shown in FIG. 2) each in communication with the central unit 10.

The central unit 10 may transmit a controlled clock signal $CLK_c$ and a controlled synchronization signal $SYNC_c$ to the plurality of RF transmission channels $CH_1$-$CH_n$ respectively, and receive respective clock echo signals $CLK_{echo\_i}$ and respective synchronization echo signals $SYNC_{echo\_i}$ from each RF transmission channel $CH_i$ (i=1-n).

The central unit 10 includes a delay compensation module 11. The delay compensation module 11 may estimate respective clock phase compensation $\Delta CLK_i$ of each RF transmission channel $CH_i$ based on the controlled clock signal $CLK_c$ transmitted and the respective clock echo signals $CLK_{echo\_i}$ received from the RF transmission channel $CH_i$, and the delay compensation module 11 may estimate respective synchronization delay compensation $\Delta SYNC_i$ of the RF transmission channel $CH_i$ based on the controlled synchronization signal $SYNC_c$ transmitted and the respective synchronization echo signal $SYNC_{echo\_i}$ received from the RF transmission channel $CH_i$.

Each of the plurality of RF transmission channels $CH_i$ includes a clock (CLK) controller 21 and a synchronization (SYNC) controller 22. The respective clock controller 21 of the RF transmission channel $CH_i$ may adjust respective clock signal received from the RF transmission channels $CH_i$ based on the respective clock phase compensation $\Delta CLK_i$ of the RF transmission channel $CH_i$. The respective synchronization controller 22 of the RF transmission channel $CH_i$ may adjust respective synchronization signal received from the RF transmission channels $CH_i$ based on the respective synchronization delay compensations $\Delta SYNC_i$ of the RF transmission channels $CH_i$. Thus, the plurality of RF transmission channels $CH_1$-$CH_n$ may be synchronized.

FIG. 2 illustrates a detailed diagram of the synchronization system 100. As shown in FIG. 2, the central unit 10 is in communication with the plurality of RF transmission channels $CH_1$-$CH_n$ via an interface 30. In the present embodiment, as an example, the central unit 10 is wirelessly communicated with the plurality of RF transmission channels $CH_1$-$CH_n$. In another embodiment, the central unit 10 may be in communication with the plurality of RF transmission channels $CH_1$-$CH_n$ via a power line (not shown) for power transmission. In still another embodiment, the central unit 10 may be also in communication with the plurality of RF transmission channels $CH_1$-$CH_n$ via a single cable (not shown).

The central unit 10 includes a transmitter 12 and an echo receiver 13, and correspondingly, each of the plurality of RF transmission channels $CH_i$ includes a receiver 23, a driver 24 and an echo transmitter 25.

The transmitter 12 of the central unit 10 is communicated with respective receiver 23 of the respective RF transmission channels $CH_i$ and may transmit the controlled clock signal $CLK_c$ and the controlled synchronization signal $SYNC_c$ respectively to the respective receiver 23 of the RF transmission channels $CH_i$.

The respective driver 24 of the RF transmission channel $CH_i$ may generate respective clock echo signal according to the clock signal received from the receiver 23 of the RF transmission channel $CH_i$, and the respective driver 24 of the RF transmission channel $CH_i$ may generate respective synchronization echo signal according to the synchronization signal received from the receiver 23 of the RF transmission channel $CH_i$.

The respective echo transmitter 25 of the RF transmission channel $CH_i$ is in communication with the echo receiver 13 of the central unit 10. The respective echo transmitter 25 of the RF transmission channels $CH_i$ may transmit the respective clock echo signals $CLK_{echo\_i}$ and the respective synchronization echo signals $SYNC_{echo\_i}$ respectively to the echo receiver 13 of the central unit 10.

In an optional embodiment, each of the plurality of RF transmission channels $CH_i$ may include a clock selection device 26 and a synchronization selection device 27. The clock selection device 26 and the synchronization selection device 27 are connected in parallel between the receiver 23 and the driver 24 of the each RF transmission channel $CH_i$. Thus, the receiver 23 of each RF transmission channel $CH_i$ may be selectively connected with the driver 24. For example, when there is no need to estimate the respective clock phase compensations $\Delta CLK_i$ and the respective synchronization delay compensations $\Delta SYNC_i$ of the RF transmission channel $CH_i$, the respective receiver 23 of the RF transmission channel $CH_i$ may be disconnected from the driver 24 by the clock selection device 26 and synchronization selection device 27.

Figure 5:
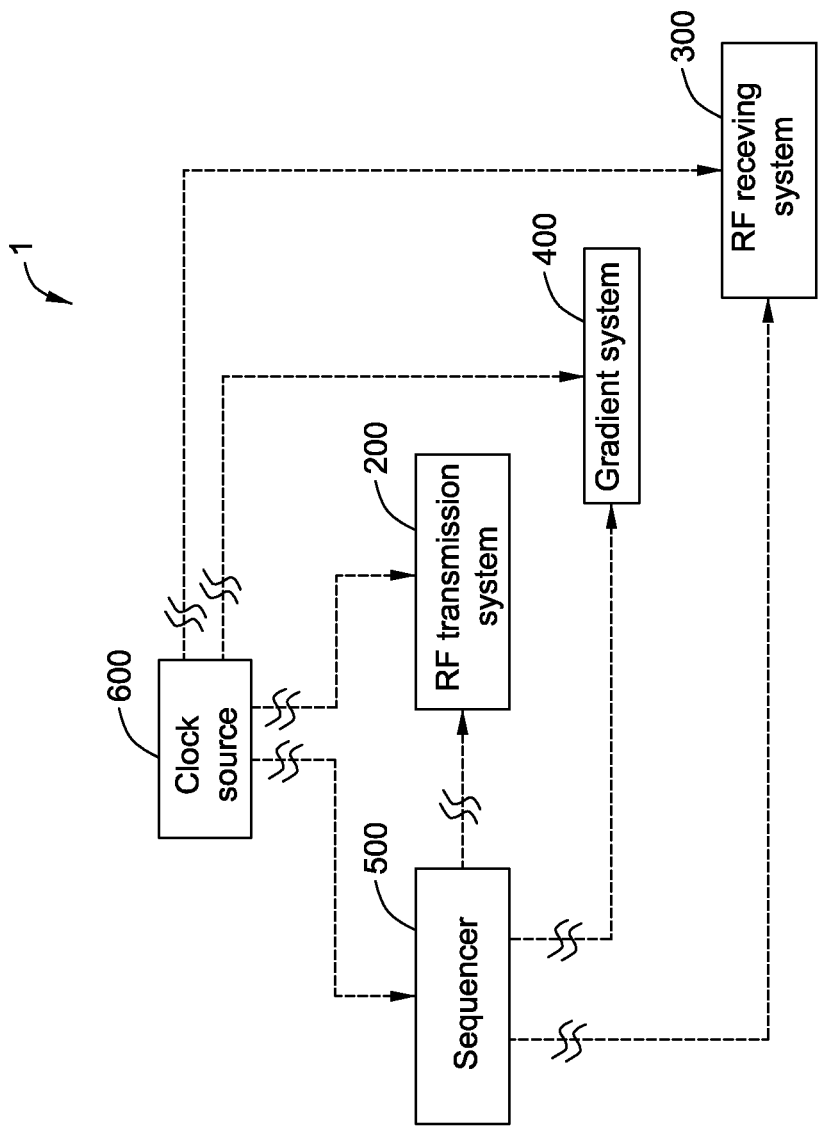
FIG. 5 is a schematic diagram of a MR system in accordance with an exemplary embodiment.

Still referring to FIG. 2, the central unit 10 may further include a pulse generator 14, a clock (CLK) distributor 15 and a synchronization (SYNC) RF controller 16. The pulse generator 14 may generate a pulse signal $S_{pulse}$ and a synchronization signal $SYNC_0$. The clock distributor 15 may receive a clock signal $CLK_0$ from a clock source 600 (as shown in FIG. 5) and the pulse signal $S_{pulse}$ to generate the controlled clock signal $CLK_c$ and distribute the controlled clock signal $CLK_c$ to the transmitter 12. The synchronization RF controller 16 may receive the synchronization signal $SYNC_0$ to generate the controlled synchronization signal $SYNC_c$ and provide the controlled synchronization signal $SYNC_c$ to the transmitter 12.

The delay compensation module 11 may include an echo detector 111, a delay calculator 112 and a multi-channel calibrator 113. The echo detector 111 may detect the respective clock echo signals $CLK_{echo\_i}$ and the respective synchronization echo signals $SYNC_{echo\_i}$ respectively received from the RF transmission channel $CH_i$. The delay calculator 112 may calculate respective clock phase delay of the respective RF transmission channel $CH_i$ based on the controlled clock signal $CLK_c$ and the respective clock echo signal $CLK_{echo\_i}$ from the RF transmission channel $CH_i$, and the delay calculator 112 may calculate respective synchronization delay of the respective RF transmission channel $CH_i$ based on the controlled synchronization signal $SYNC_c$ and the respective synchronization echo signal $SYNC_{echo\_i}$ from the respective RF transmission channel $CH_i$. The multi-channel calibrator 113 may determine the respective clock phase compensation $\Delta CLK_i$ of the RF transmission channel $CH_i$ based on the calculated respective clock phase delay of the RF transmission channel $CH_i$, and the multi-channel calibrator 113 may determine the respective synchronization delay compensation $\Delta SYNC_i$ of the RF transmission channel $CH_i$ based on the calculated respective synchronization delay of the RF transmission channels $CH_i$.

As an example, the central unit 10 may include a wireless communicator 17, and correspondingly, each of the plurality of RF transmission channels $CH_i$ may include a wireless receiver 28.

The wireless communicator 17 of the central unit 10 may transmit the respective clock phase compensations $\Delta CLK_i$ and the respective synchronization delay compensations $\Delta SYNC_i$ of the RF transmission channel $CH_i$ to the respective wireless receivers 28 of the RF transmission channel $CH_i$ respectively.

The respective wireless receiver 28 of the RF transmission channel $CH_i$ may receive and provide the respective clock phase compensation $\Delta CLK_i$ and the respective synchronization delay compensation $\Delta SYNC_i$ of the RF transmission channel $CH_i$ to the respective clock controller 21 and the respective synchronization controller 22 of the RF transmission channel $CH_i$ respectively.

The respective clock controller 21 of the RF transmission channel $CH_i$ may add the respective synchronization delay compensation $\Delta SYNC_i$ to the respective clock signal received from the RF transmission channel $CH_i$.

The respective synchronization controller 22 of the RF transmission channel $CH_i$ may add the respective synchronization delay compensation $\Delta SYNC_i$ to the respective synchronization signal received from the RF transmission channels $CH_i$.

In one embodiment, the controlled clock signal $CLK_c$ is a modulated clock signal and the controlled synchronization signal $SYNC_c$ is a modulated synchronization signal.

Each of the plurality of RF transmission channel $CH_i$ may further include a decoder 29. The respective decoders 29 of the respective RF transmission channel $CH_i$ may decode the respective clock signal and the respective synchronization signal received from the respective RF transmission channel $CH_i$ and provide the respective decoded clock signal and the respective decoded synchronization signal of the RF transmission channel $CH_i$ to the respective clock controller 21 and the respective synchronization controller 22 of the RF transmission channel $CH_i$ respectively. Under this circumstance, the respective clock controller 21 of the RF transmission channel $CH_i$ may add the respective synchronization delay compensation $\Delta SYNC_i$ of the RF transmission channel $CH_i$ to the respective decoded clock signal, and the respective synchronization controller 22 of the RF transmission channels $CH_i$ may add the respective synchronization delay compensation $\Delta SYNC_i$ of the RF transmission channel $CH_i$ to the respective decoded synchronization signal.

Figure 3:
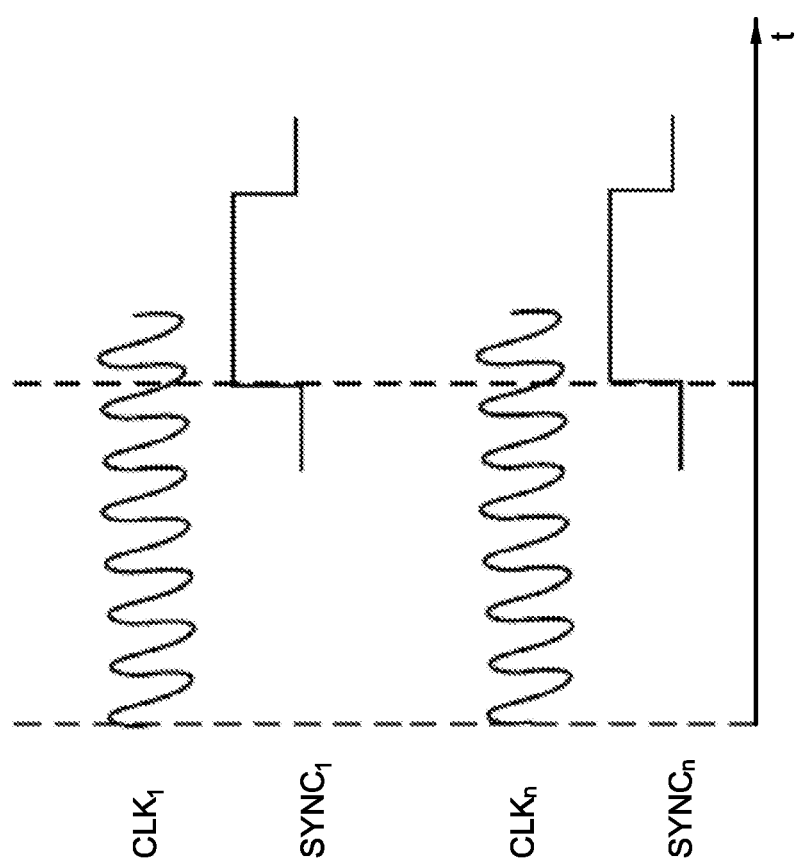
FIG. 3 illustrates waveforms of clock signals and synchronization signals from the first and the last RF transmission channels of FIG. 2.

FIG. 3 illustrates waveforms of clock signals $CLK_1$, $CLK_n$ and synchronization signals $SYNC_1$, $SYNC_n$ from the first RF transmission channel $CH_1$ and the last RF transmission channel $CH_n$ of FIG. 2. It can be clearly seen from FIG. 3 that the adjusted clock signal $CLK_1$ of the first RF transmission channel $CH_1$ and the adjusted clock signal $CLK_n$ of the last RF transmission channel $CH_n$ may keep synchronization, and the adjusted synchronization signal $SYNC_1$ of the first RF transmission channel $CH_1$ and the adjusted synchronization signal $SYNC_n$ of the last RF transmission channel $CH_n$ may also keep synchronization. Thus, the synchronization system 100 of the present disclosure may synchronize the plurality of RF transmission channels $CH_1$-$CH_n$.

It should be understood that in some embodiments, the above-mentioned clock phase compensation and the synchronization delay compensation may be performed for a portion of the plurality of RF transmission channels $CH_1$-$CH_n$. For example, a portion of RF transmission channels may be wirelessly communicated with the central unit 10, or may be communicated with the central unit 10 via a power line for power transmission or via a single cable, and the remainder of the RF transmission channels $CH_1$-$CH_n$ may be connected to the central unit 10 still via a conventional wiring mode. Under this circumstance, the clock phase compensation and the synchronization delay compensation may be performed on this portion of RF transmission channels only. Therefore, any solution of the above-mentioned performing the clock phase compensation and the synchronization delay compensation for at least one RF transmission channel should be covered within the protecting scope of the attached claims.

Synchronization Method for RF Transmission

Figure 4:
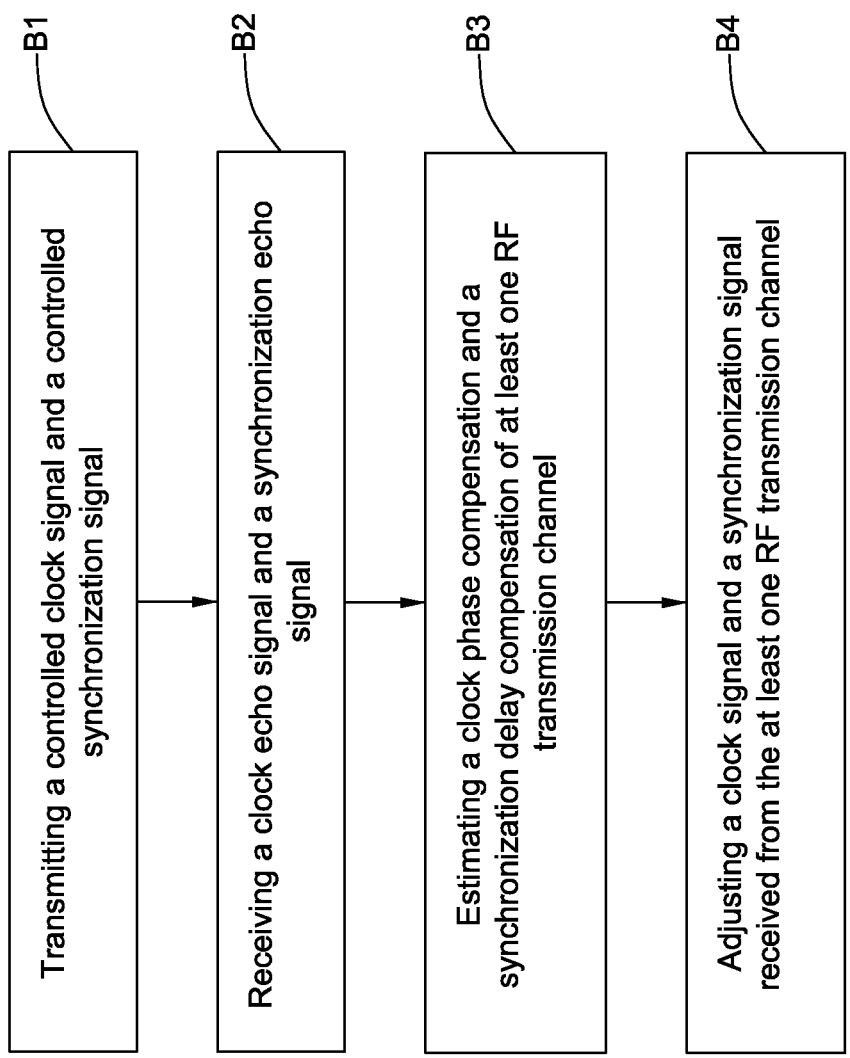
FIG. 4 is a schematic diagram of a synchronization method for RF transmission in accordance with an exemplary embodiment.

FIG. 4 is a schematic diagram of a synchronization method for RF transmission in accordance with one embodiment of the present invention. The synchronization method may include the steps as follows.

As shown in FIG. 4, in block B1, a controlled clock signal and a controlled synchronization signal are transmitted via at least one RF transmission channel.

In block B2, respective clock echo signal and respective synchronization echo signal are received via each RF transmission channel.

In block B3, a clock phase compensation of the at least one RF transmission channel is estimated based on the controlled clock signal transmitted and the received clock echo signal of the at least one RF transmission channel, and a synchronization delay compensation of the at least one RF transmission channel is estimated based on the controlled synchronization signal transmitted and the received synchronization echo signal of the at least one RF transmission channel.

In block B4, a clock signal received from the at least one RF transmission channel is adjusted based on the clock phase compensation of the at least one RF transmission channel, and a synchronization signal received from the at least one RF transmission channel is adjusted based on the synchronization delay compensation of the at least one RF transmission channel.

The synchronization method of the present disclosure may achieve the synchronization of a plurality of RF transmission channels.

MR System

FIG. 5 illustrates a schematic diagram of a MR system 1 in accordance with a first embodiment of the present disclosure. As shown in FIG. 5, the MR system 1 of the first embodiment includes a RF transmission system 200, a RF receiving system 300, a gradient system 400, a sequencer 500 and a clock source 600. The RF transmission system 200 may include the synchronization system 100 above mentioned.

The sequencer 500 is communicated with the RF transmission system 200, the RF receiving system 300 and the gradient system 400 respectively, and the sequencer 500 may generate a sequence to the RF transmission system 200, the RF receiving system 300 and the gradient system 400. The sequence may include a preloaded or predefined data package sequence, and reliable wireless RF commanding can be thus ensured.

The clock source 600 may generate a clock signal $CLK_0$ and sending the clock signal $CLK_0$ to the sequencer 500, the RF transmission system 200, the RF receiving system 300 and the gradient system 400 respectively.

As an example, the sequencer 500 is wirelessly communicated with the RF transmission system 200, the RF receiving system 300 and the gradient system 400, and the clock source 600 is wirelessly connected with the sequencer 500, the RF transmission system 200, the RF receiving system 300 and the gradient system 400 respectively.

In response to respective adjusted clock signals and respective adjusted synchronization signals, the RF transmission channel $CH_i$ of the RF transmission system 200 may start to transmit respective transmission data commands in the sequence.

In one embodiment, the central unit 10 of the synchronization system 100 may be integrated in the sequencer 500. In another embodiment, the central unit 10 of the synchronization system 100 may be integrated in one of the plurality of RF transmission channels $CH_i$.

The clock source 600 may be integrated in the central unit 10 of the synchronization system 100.

Figure 6:
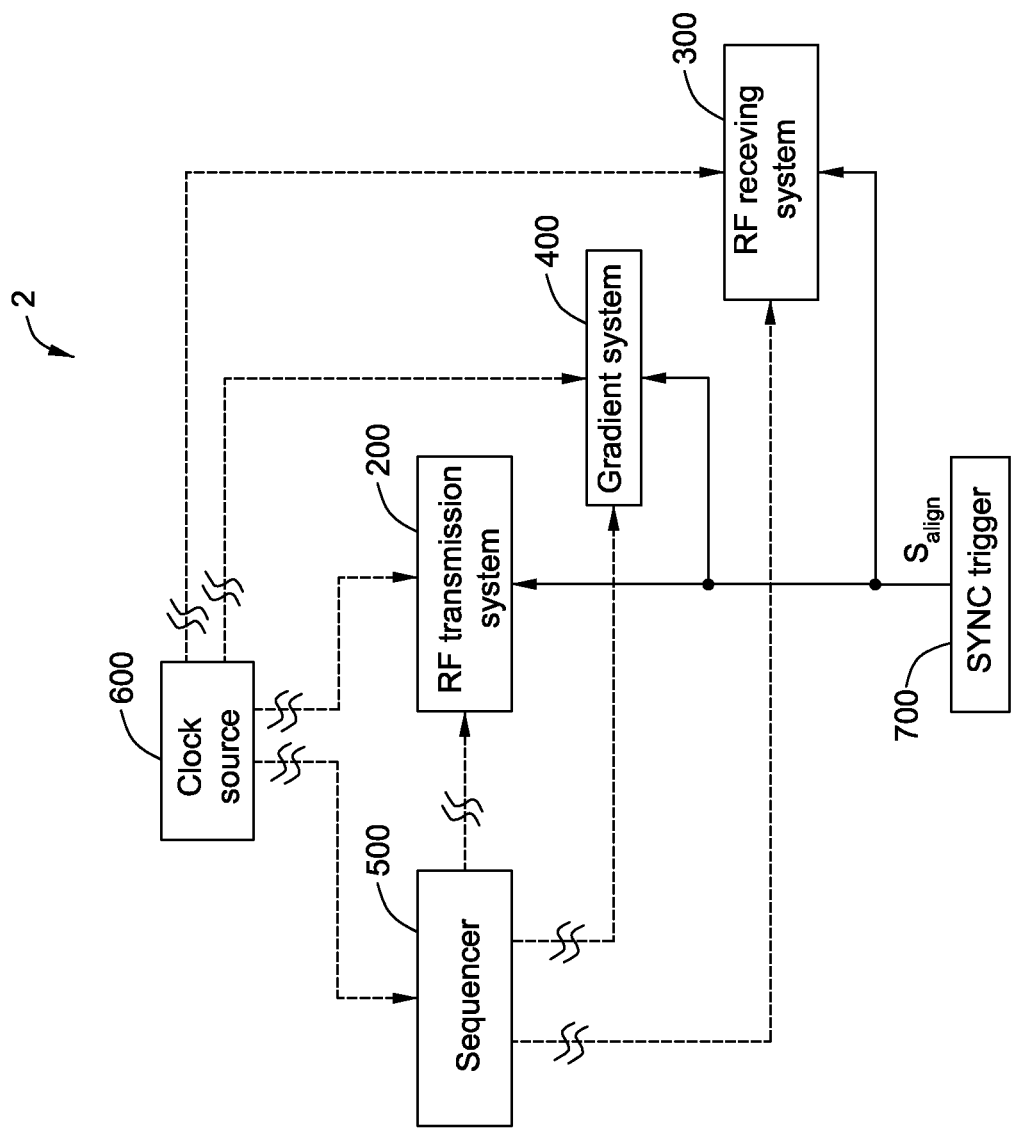
FIG. 6 is a schematic diagram of a MR system in accordance with another exemplary embodiment.

FIG. 6 illustrates a schematic diagram of a MR system 2 in accordance with a second embodiment of the present disclosure. As shown in FIG. 6, the MR system 2 of the second embodiment includes a RF transmission system 200, a RF receiving system 300, a gradient system 400, a sequencer 500 wirelessly communicated with the RF transmission system 200, the RF receiving system 300 and the gradient system 400 respectively, and a clock source 600 wirelessly connected with the sequencer 500, the RF transmission system 200, the RF receiving system 300 and the gradient system 400 respectively.

Different from the MR system 1 of FIG. 5, the MR system 2 of FIG. 6 may further include a synchronization (SYNC) trigger 700 for triggering an alignment signal $S_{align}$. The synchronization trigger 700 may include, for example, a RF coil of the RF transmission system 200 or an independent coil from the RF transmission system 200.

In response to the alignment signal $S_{align}$, the RF transmission system 200, the RF receiving system 300 and the gradient system 400 may start to play out respective data commands in the sequence.

The MR system 2 of the second embodiment may ensure synchronization among sub-systems.

In the MR system 2 of the second embodiment, the RF transmission system 200 may also include the synchronization system 100 of the present disclosure. Thus, under this circumstance, the MR system 2 may not only ensure the synchronization of the plurality of RF transmission channels, but also ensure the synchronization among sub-systems.

While steps of the synchronization method for RF transmission in accordance with embodiments of the present disclosure are illustrated as functional blocks, the order of the blocks and the separation of the steps among the various blocks shown in FIG. 4 are not intended to be limiting. For example, the blocks may be performed in a different order and a step associated with one block may be combined with one or more other blocks or may be sub-divided into a number of blocks.

While the disclosure has been illustrated and described in typical embodiments, it is not intended to be limited to the details shown, since various modifications and substitutions can be made without departing in any way from the spirit of the present disclosure. As such, further modifications and equivalents of the disclosure herein disclosed may occur to persons skilled in the art using no more than routine experimentation, and all such modifications and equivalents are believed to be within the spirit and scope of the disclosure as defined by the following claims.

What is claimed is:

1. A synchronization system based on wireless or limited cable interconnection, comprising:
   a central unit comprising a delay compensation module; and
   a plurality of RF transmission channels each in communication with the central unit, at least one of which comprises a clock controller and a synchronization controller,
   wherein the central unit is configured to transmit a controlled clock signal and a controlled synchronization signal to the at least one RF transmission channel respectively, and receive a clock echo signal and a synchronization echo signal from the at least one RF transmission channel respectively;

the delay compensation module of the central unit is configured to estimate a clock phase compensation of the at least one RF transmission channel based on the controlled clock signal transmitted and the clock echo signal received from the at least one RF transmission channel, and estimate a synchronization delay compensation of the at least one RF transmission channel based on the controlled synchronization signal transmitted and the synchronization echo signal received from the at least one RF transmission channel; and the clock controller and the synchronization controller of the at least one RF transmission channel are respectively configured to adjust a clock signal received from the at least one RF transmission channel based on the clock phase compensation of the at least one RF transmission channel, and adjust a synchronization signal received from the at least one RF transmission channel based on the synchronization delay compensation of the at least one RF transmission channel.

2. The synchronization system of claim 1, wherein the central unit comprises a transmitter and an echo receiver; and the at least one RF transmission channel comprises a receiver, a driver and an echo transmitter, the transmitter being in communication with the receiver of the at least one RF transmission channel and configured to transmit the controlled clock signal and the controlled synchronization signal respectively to the receiver of the at least one RF transmission channel;

the driver of the at least one RF transmission channel being configured to generate a clock echo signal according to the clock signal received from the receiver of the at least one RF transmission channel and generate a synchronization echo signal according to the synchronization signal received from the receiver of the at least one RF transmission channel; and the echo transmitter of the at least one RF transmission channel being in communication with the echo receiver and configured to transmit the clock echo signal and the synchronization echo signal respectively to the echo receiver.

3. The synchronization system of claim 2, wherein the at least one RF transmission channel comprises a clock selection device and a synchronization selection device connected in parallel between the receiver and the driver of the at least one RF transmission channel.

4. The synchronization system of claim 1, wherein the central unit comprises:

a pulse generator for generating a pulse signal and a synchronization signal;

a clock distributor for receiving a clock signal from a clock source and the pulse signal to generate the controlled clock signal and distribute the controlled clock signal to the transmitter; and a synchronization RF controller for receiving the synchronization signal to generate the controlled synchronization signal and providing the controlled synchronization signal to the transmitter.

5. The synchronization system of claim 1, wherein delay compensation module comprises:

an echo detector for detecting the clock echo signal and the synchronization echo signal respectively received from the at least one RF transmission channel;

a delay calculator for calculating a clock phase delay of the at least one RF transmission channel based on the controlled clock signal and the clock echo signal from the at least one RF transmission channel, and calculating a synchronization delay of the at least one RF transmission channel based on the controlled synchronization signal and the synchronization echo signal from the at least one RF transmission channel; and a multi-channel calibrator for determining the clock phase compensation of the at least one RF transmission channel based on the calculated clock phase delay of the at least one RF transmission channel, and determining the synchronization delay compensation of the at least one RF transmission channel based on the calculated synchronization delay of the at least one RF transmission channel.

6. The synchronization system of claim 1, wherein the central unit is wirelessly communicated with the at least one RF transmission channel.

7. The synchronization system of claim 6, wherein the central unit comprises a wireless communicator, and the at least one RF transmission channel comprises a wireless receiver, the wireless communicator of the central unit being configured to transmit the clock phase compensation and the synchronization delay compensation of the at least one RF transmission channel to the wireless receiver of the at least one RF transmission channel respectively; and the wireless receiver of the at least one RF transmission channel being configured to receive and provide the clock phase compensation and the synchronization delay compensation of the at least one RF transmission channel to the clock controller and the synchronization controller of the at least one RF transmission channel respectively.

8. The synchronization system of claim 1, wherein the central unit is communicated with the at least one RF transmission channel via a power line for power transmission or via a single cable.

9. The synchronization system of claim 1, wherein the controlled clock signal is a modulated clock signal and the controlled synchronization signal is a modulated synchronization signal.

10. The synchronization system of claim 1, wherein the at least one RF transmission channel comprises a decoder, the decoder of the at least one RF transmission channel being configured to decode the clock signal and the synchronization signal received from the at least one RF transmission channel and provide the decoded clock signal and the decoded synchronization signal of the at least one RF transmission channel to the clock controller and the synchronization controller of the at least one RF transmission channel respectively.

11. A MR system, comprising:

a RF transmission system comprising a plurality of RF transmission channels;

a RF receiving system;

a gradient system;

a sequencer in communication with the RF transmission system, the RF receiving system and the gradient system respectively, and configured to generate a sequence to the RF transmission system, the RF receiving system and the gradient system; and a clock source configured to generate a clock signal and send the clock signal to the sequencer, the RF transmission system, the RF receiving system, and the gradient system, respectively; and a synchronization system configured to generate a synchronization signal and send the synchronization signal to the sequencer, the RF transmission system, the RF receiving system, and the gradient system, the synchronization system further comprising:
a central unit in wireless communication with the plurality of RF transmission channels, the central unit configured to estimate a clock phase compensation of at least one RF transmission channel and a synchronization delay compensation of at least one RF transmission channel,
wherein the plurality of RF transmission channels are configured to adjust the clock signal based on the clock phase compensation of the at least one of the RF transmission channels and configured to adjust the synchronization signal based on the synchronization delay compensation of the at least one RF transmission channel, and
wherein in response to the adjusted clock signal and the adjusted synchronization signal of the at least one RF transmission channel, the at least one RF transmission channel starts to transmit a transmission data command in the sequence.

12. The MR system of claim 11, wherein the central unit of the synchronization system is integrated in the sequencer, or is integrated in one of the plurality of RF transmission channels.

13. The MR system of claim 11, wherein the clock source is integrated in the central unit of the synchronization system.

14. The MR system of claim 11, wherein the sequencer is wirelessly communicated with the RF transmission system, the RF receiving system and the gradient system, and the clock source is wirelessly connected with the sequencer, the RF transmission system, the RF receiving system and the gradient system respectively.

15. The MR system of claim 14, further comprising:
a synchronization trigger for triggering an alignment signal,
wherein in response to the alignment signal, the RF transmission system, the RF receiving system and the gradient system start to play out respective data commands in the sequence.

16. The MR system of claim 15, wherein the synchronization trigger comprises a RF coil of the RF transmission system or an independent coil from the RF transmission system.

17. The MR system of claim 11, wherein the sequence comprises a preloaded or predefined data package sequence.

18. A MR system, comprising:
a RF transmission system comprising a plurality of RF transmission channels;
a RF receiving system;
a gradient system;
a sequencer wirelessly in communication with the RF transmission system, the RF receiving system, and the gradient system respectively, and configured to generate a sequence to the RF transmission system, the RF receiving system, and the gradient system;
a clock source wirelessly connected with the sequencer, the RF transmission system, the RF receiving system and the gradient system respectively, the clock source configured to generate and send a clock signal;
a synchronization system configured to generate a synchronization signal and send the synchronization signal to the sequencer, the RF transmission system, the RF receiving system, and the gradient system, the synchronization system further comprising:
a central unit in wireless communication with the plurality of RF transmission channels, the central unit configured to estimate a clock phase compensation of at least one RF transmission channel and a synchronization delay compensation of at least one RF transmission channel,
a synchronization trigger for triggering an alignment signal,
wherein in response to the alignment signal, the RF transmission system, the RF receiving system, and the gradient system start to play out respective data commands in the sequence.

19. The MR system of claim 18, wherein the synchronization trigger comprises a RF coil of the RF transmission system or an independent coil from the RF transmission system.

20. The MR system of claim 18, wherein the sequence comprises a preloaded or predefined data package sequence.

21. A synchronization method for RF transmission, comprising:
transmitting a controlled clock signal and a controlled synchronization signal via at least one RF transmission channel;
receiving a clock echo signal and a synchronization echo signal via the at least one RF transmission channel;
estimating a clock phase compensation of the at least one RF transmission channel based on the controlled clock signal transmitted and the received clock echo signal of the at least one RF transmission channel, and a synchronization delay compensation of the at least one RF transmission channel based on the controlled synchronization signal transmitted and the received synchronization echo signal of the at least one RF transmission channel; and
adjusting a clock signal received from the at least one RF transmission channel based on the clock phase compensation of the at least one RF transmission channel, and a synchronization signal received from the at least one RF transmission channel based on the synchronization delay compensation of the at least one RF transmission channel.

* * * * *